United States Patent
Kim et al.

(10) Patent No.: US 12,230,651 B2
(45) Date of Patent: Feb. 18, 2025

(54) PHOTODETECTOR AND IMAGE SENSOR INCLUDING THE SAME

(71) Applicant: SAMSUNG ELECTRONICS CO., LTD., Suwon-si (KR)

(72) Inventors: Sungjun Kim, Incheon (KR); Jin-Hong Park, Suwon-si (KR); Sunghun Lee, Suwon-si (KR); Keun Heo, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 473 days.

(21) Appl. No.: 17/668,566

(22) Filed: Feb. 10, 2022

(65) Prior Publication Data

US 2022/0384500 A1  Dec. 1, 2022

(30) Foreign Application Priority Data

May 26, 2021 (KR) .................. 10-2021-0067460

(51) Int. Cl.
*H01L 27/14* (2006.01)
*H01L 27/146* (2006.01)

(52) U.S. Cl.
CPC .. *H01L 27/14607* (2013.01); *H01L 27/14614* (2013.01); *H01L 27/14627* (2013.01); *H01L 27/14649* (2013.01); *H01L 27/14621* (2013.01)

(58) Field of Classification Search
CPC ......... H01L 27/14607; H01L 27/14614; H01L 27/14621; H01L 27/14627; H01L 27/14649

See application file for complete search history.

(56) References Cited

U.S. PATENT DOCUMENTS

| | | | |
|---|---|---|---|
| 8,330,171 B2 | 12/2012 | Dosunmu et al. | |
| 9,263,607 B2 | 2/2016 | Yoo et al. | |
| 2014/0175284 A1 | 6/2014 | Roh et al. | |
| 2015/0241283 A1 | 8/2015 | Lee et al. | |
| 2016/0356652 A1 | 12/2016 | Yun et al. | |
| 2020/0343392 A1 | 10/2020 | Chung et al. | |
| 2021/0025761 A1 | 1/2021 | Altenbeck et al. | |
| 2021/0036024 A1* | 2/2021 | Kim | H10B 51/30 |

FOREIGN PATENT DOCUMENTS

| | | |
|---|---|---|
| JP | 2011-192873 A | 9/2011 |
| KR | 10-2001-0026737 A | 4/2001 |
| KR | 10-2014-0075350 A | 6/2014 |
| KR | 10-2014-0080206 A | 6/2014 |
| KR | 10-2015-0101713 A | 9/2015 |
| KR | 10-2018-0017991 A | 2/2018 |

* cited by examiner

*Primary Examiner* — Kevin K Pyo
(74) *Attorney, Agent, or Firm* — Muir Patent Law, PLLC

(57) ABSTRACT

A photodetector includes a gate electrode extending in a first direction, a ferroelectric layer on the gate electrode and maintaining a state of polarization formed by a gate voltage applied to the gate electrode, a light absorbing layer on the ferroelectric layer and extending in a second direction intersecting the gate electrode, the light absorbing layer including a two-dimensional (2D) material of a layered structure, a source electrode on the ferroelectric layer and connected to a first end of the light absorbing layer, and a drain electrode on the ferroelectric layer and connected to the a second end of the light absorbing layer.

19 Claims, 13 Drawing Sheets

III-III'

PHOTODETECTOR AND IMAGE SENSOR INCLUDING THE SAME

CROSS-REFERENCE TO RELATED APPLICATION

This application claims the benefit under 35 USC 119(a) of Korean Patent Application No. 10-2021-0067460, filed on May 26, 2021, in the Korean Intellectual Property Office, the entire disclosure of which is incorporated herein by reference for all purposes.

BACKGROUND

1. Field

Embodiments relate to a photodetector and an image sensor including the same.

2. Description of the Related Art

Image sensors are semiconductor-based sensors receiving light and generating electrical signals, and may include pixel arrays including a plurality of pixels including photodetectors. In such a photodetector, the minimum energy of detected light is determined by the size of the bandgap of the semiconductor. In this case, the photodetector detects light corresponding to the minimum energy of the semiconductor or light having energy greater than the minimum energy. Recently, various methods have been proposed for generating images of various wavelength ranges by increasing the wavelength range of light detected by a photodetector.

SUMMARY

According to example embodiments, a photodetector includes a gate electrode disposed in a first direction, a ferroelectric layer disposed on the gate electrode and maintaining a state of polarization formed by a gate voltage applied to the gate electrode, a light absorbing layer disposed on the ferroelectric layer in a second direction, intersecting the gate electrode and including a two-dimensional (2D) material of a layered structure, a source electrode disposed on the ferroelectric layer and connected to one end of the light absorbing layer, and a drain electrode disposed on the ferroelectric layer and connected to the other end of the light absorbing layer.

According to example embodiments, a photodetector includes a gate electrode disposed in a first direction, a ferroelectric layer disposed on the gate electrode and maintaining a state of polarization formed by a gate voltage applied to the gate electrode, a first light absorbing layer disposed on the ferroelectric layer in a second direction, intersecting the gate electrode and including a first two-dimensional (2D) material having a layered structure, a second light absorbing layer disposed on the ferroelectric layer to intersect the gate electrode, having an overlap region overlapping the first light absorbing layer, and including a second two-dimensional material, different from the first two-dimensional material, a source electrode disposed on the ferroelectric layer and connected to the first light absorbing layer, and a drain electrode disposed on the ferroelectric layer and connected to the second light absorbing layer.

According to example embodiments, an image sensor includes a semiconductor array having a plurality of pixel areas each having a photodetector disposed therein, a carrier substrate disposed below the semiconductor array and including a wiring layer, a plurality of optical filters disposed on the semiconductor array and respectively disposed in the plurality of pixel areas, and a plurality of microlenses disposed on the plurality of optical filters to correspond to the plurality of pixel areas, respectively. The photodetector includes a support substrate disposed on the carrier substrate, a gate electrode disposed on the support substrate, a ferroelectric layer disposed on the gate electrode and maintaining a state of polarization formed by a gate voltage applied to the gate electrode, a first light absorbing layer disposed on the ferroelectric layer to intersect the gate electrode and including a first two-dimensional (2D) material having a layered structure, a second light absorbing layer disposed on the ferroelectric layer to intersect the gate electrode, having a region overlapping the first light absorbing layer, and including a second two-dimensional material, different from the first two-dimensional material, a source electrode disposed on the ferroelectric layer and connected to the first light absorbing layer, and a drain electrode disposed on the ferroelectric layer and connected to the second light absorbing layer.

BRIEF DESCRIPTION OF DRAWINGS

Features will become apparent to those of skill in the art by describing in detail exemplary embodiments with reference to the attached drawings, in which.

DETAILED DESCRIPTION

Figure 1:
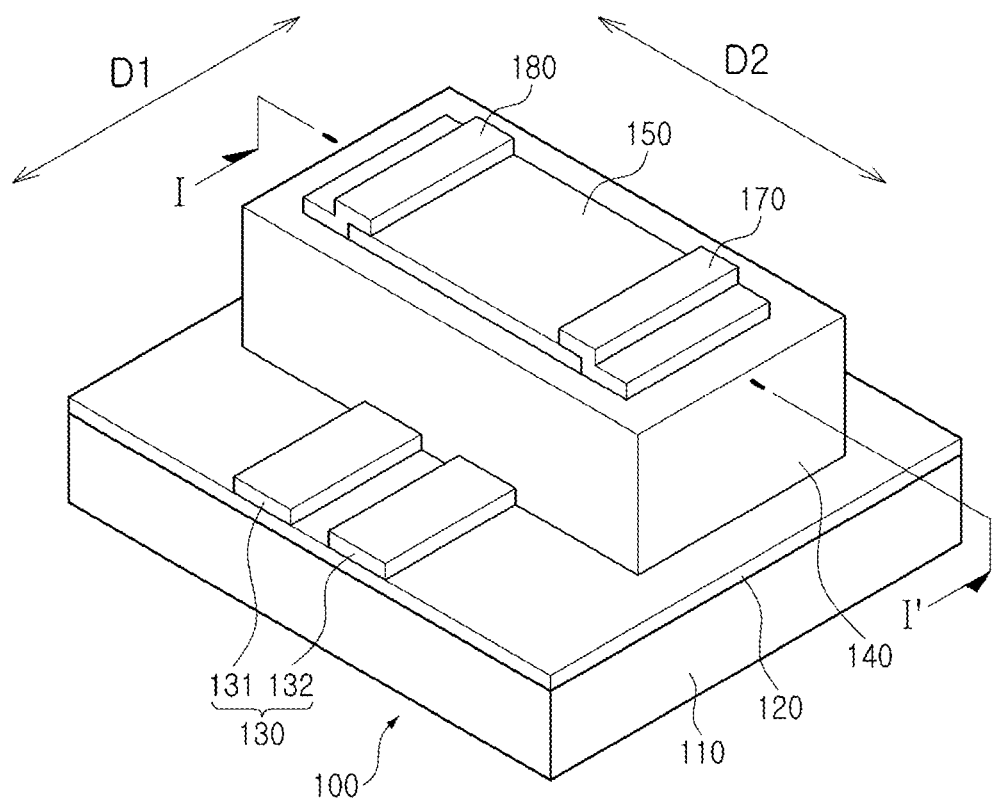
FIG. 1 is a schematic perspective view of a photodetector according to an example embodiment.

A photodetector 100 according to an example embodiment will be described with reference to FIGS. 1 and 2. FIG. 1 is a schematic perspective view of the photodetector 100, and FIG. 2 is a cross-sectional view along line I-I' of FIG. 1.

Figure 2:
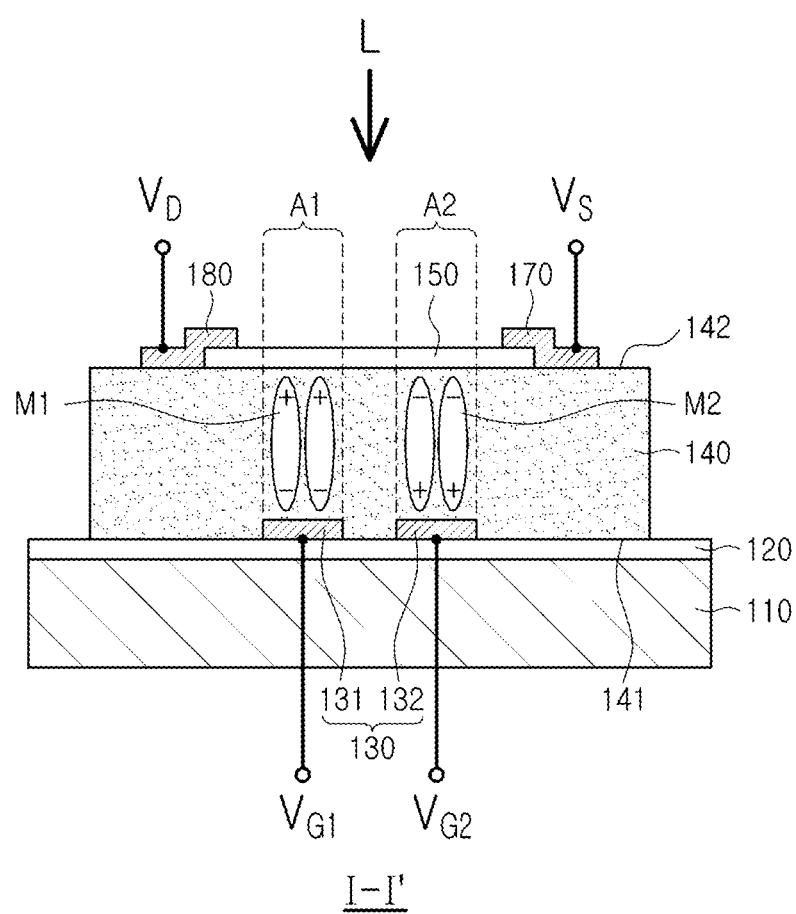
FIG. 2 is a side cross-sectional view of a cross-section along line I-I' of FIG. 1.

Referring to FIGS. 1 and 2, the photodetector 100 may include a gate electrode 130, a ferroelectric layer 140 disposed on the gate electrode 130, a light absorbing layer 150 disposed on the ferroelectric layer 140, and a source electrode 170 and a drain electrode 180 disposed on opposite, e.g., both, ends of the light absorbing layer 150. In some embodiments, a support substrate 110 may be disposed below the gate electrode 130.

The support substrate 110 may be a support for supporting the gate electrode 130 and the ferroelectric layer 140, and may be omitted depending on an example embodiment. The support substrate 110 may be formed of at least one of, e.g., a silicon (Si) substrate, a germanium (Ge) substrate, a glass substrate, and a polyethylene terephthalate (PET) substrate, but is not limited thereto. An insulating layer 120 may be disposed on the upper surface of the support substrate 110 to insulate between the support substrate 110 and the gate electrode 130 and the ferroelectric layer 140.

Referring to FIG. 2, the ferroelectric layer 140 may be formed in a film shape having a first surface 141 and a second surface 142 positioned to oppose the first surface. The first surface 141 may be a lower surface of the ferroelectric layer 140, e.g., the first surface 141 may face the insulating layer 120, and the second surface 142 may be an upper surface of the ferroelectric layer 140, e.g., the second surface 142 may face the light absorbing layer 150. The ferroelectric layer 140 may be disposed to cover the upper and side surfaces of the gate electrode 130. In some embodiments, the ferroelectric layer 140 may be disposed such that only the upper surface of the gate electrode 130 may be in contact with the first surface 141 of the ferroelectric layer 140. Also, the ferroelectric layer 140 may be disposed in a second direction D2 intersecting a first direction D1 in which the gate electrode 130 is disposed, e.g., a longitudinal direction of the ferroelectric layer 140 in the second direction D2 may intersect a longitudinal direction of the gate electrode 130 in the first direction D1. The ferroelectric layer 140 may include a ferroelectric material. The ferroelectric material may include at least one of polyvinylidenefluoride (PVDF), a copolymer of vinylidene fluoride and ethylene trifluoride (P(VDF-TrFE)), a copolymer of vinylidene cyanide and vinyl acetate (P(VDCN-VAc)), nylon-11, polyurea-9, polyvinylchloride (PVC), polyacrylonitrile (PAN), and poly(phthalazinone ether nitrile (PPEN).

In an example embodiment, the ferroelectric layer 140 may include P(VDF-TrFE). When the ferroelectric layer 140 includes P(VDF-TrFE), dipole moments M1 and M2 due to a hydrogen atom (H) and a fluorine atom (F) included in the ferroelectric layer 140 may be provided. The hydrogen atom (H) may have a positive polarity (δ+), and the fluorine atom (F) may have a negative polarity (δ−). For example, switching regions A1 and A2, i.e., regions including respective reversed polarities of the dipole moments M1 and M2, may be defined, e.g., formed, in the ferroelectric layer 140, e.g., above the gate electrode 130.

Referring to FIG. 1, the gate electrode 130 may be disposed below the ferroelectric layer 140 in the first direction D1, to intersect the ferroelectric layer 140. The gate electrode 130 may be formed of a conductive material, e.g., titanium (Ti), platinum (Pt), gold (Au), palladium (Pd), chromium (Cr), molybdenum (Mo), super duralumin (SD), or the like.

Referring to FIG. 2, when a voltage having a magnitude greater than or equal to a coercive voltage is applied to the gate electrode 130 for a predetermined time or longer, the switching regions A1 and A2 in which the polarities of the dipole moments M1 and M2 disposed in the region of the ferroelectric layer 140, adjacent to the gate electrode 130, are reversed are formed, and the state thereof may be maintained.

In addition, as a gate voltage $V_G$ is increased to a positive value, spontaneous polarization of which the polarity is reversed may increase in the switching regions A1 and A2. In addition, as the gate voltage $V_G$ is decreased to a negative value, the spontaneous polarization of which the polarity is reversed may be decreased in the switching regions A1 and A2. For example, as illustrated in FIG. 2, the first switching region A1 and the second switching region A2 may be formed in the ferroelectric layer 140 by a first gate electrode 131 of the gate electrode 130 and a second gate electrode 132 of the gate electrode 130, respectively.

In detail, the gate electrode 130 may include a plurality of electrodes. The plurality of electrodes may be disposed parallel to each other in the first direction D1. In the case of an example embodiment, a case in which the gate electrode 130 includes the first and second gate electrodes 131 and 132 will be described as an example. A first gate voltage $V_{G1}$ and a second gate voltage $V_{G2}$ having a magnitude greater than or equal to the coercive voltage and having different polarities may be applied to the first and second gate electrodes 131 and 132, respectively, e.g., the magnitude of the first and second gate voltages $V_{G1}$ and $V_{G2}$ may be in a range of 50 V to 80 V.

The light absorbing layer 150 may be disposed on the second surface 142 of the ferroelectric layer 140 to intersect the gate electrode 130. The source electrode 170 and the drain electrode 180 may be disposed on opposite, e.g., both, ends of the light absorbing layer 150, respectively, to receive a source voltage $V_S$ and a drain voltage $V_D$.

The light absorbing layer 150 may absorb light L irradiated from the front, e.g., from the top oriented in a direction from the light absorbing layer 150 toward the support substrate 110, to generate a photocurrent. When the light absorbing layer 150 absorbs the light L, electrons and holes are generated therein, and a photocurrent may be generated according to the movement of the electrons and holes. For example, holes generated by light absorption of the light absorbing layer 150 may move toward the source electrode 170, and electrons generated by the light absorption of the light absorbing layer 150 may move toward the drain electrode 180.

The light absorbing layer 150 may include a two-dimensional (2D) material having a layered structure. A 2D material is a single-layer or half-layer solid in which atoms form a 2D crystal structure. The 2D material may include a transition metal dichalcogenide material. The transition metal dichalcogenide material may include, e.g., tungsten disulfide ($WS_2$), tungsten diselenide ($WSe_2$), molybdenum disulphide ($MoS_2$), molybdenum diselenide ($MoSe_2$), rhenium disulfide ($ReS_2$) and/or rhenium diselenide ($ReSe_2$).

When a positive gate voltage $V_G$ is applied to the gate electrode 130, a positive polarity is disposed on the second surface 142 of the ferroelectric layer 140, such that electrons are concentrated in the light absorbing layer 150, and thus, the energy band is lowered. Conversely, when a negative gate voltage $V_G$ is applied to the gate electrode 130, a negative polarity is disposed on the second surface 142 of the ferroelectric layer 140 to concentrate holes in the light absorbing layer 150, and thus, the energy band increases.

The source electrode 170 and the drain electrode 180 may be coupled to opposite, e.g., both, ends of the light absorbing layer 150. Also, in some embodiments, a partial region of the source electrode 170 and a partial region of the drain electrode 180 may directly contact the second surface 142 of the ferroelectric layer 140. The source electrode 170 and the drain electrode 180 may be formed of, e.g., at least one of titanium (Ti), aluminum (Al), erbium (Er), platinum (Pt), gold (Au), and palladium (Pd).

The light absorbing layer 150 absorbs the light L irradiated from the front to generate a photocurrent, thereby detecting light. The minimum energy of light absorbed by the light absorbing layer 150 is determined by the size of the bandgap of a semiconductor material constituting the light absorbing layer 150. In addition, the light absorbing layer 150 may absorb only a wavelength of a predetermined band from the minimum energy of the absorbed light.

Therefore, in the related art, after the light absorbing layer is manufactured, the wavelength band of the light absorbed by the light absorbing layer cannot be changed. The photodetector 100 according to an example embodiment may adjust the energy band of the light absorbing layer 150 by adjusting the gate voltage $V_G$ applied to the ferroelectric layer 140 disposed below the light absorbing layer 150. Accordingly, the wavelength band of the light absorbed by the light absorbing layer 150 may be changed by adjusting the minimum energy of the light absorbed by the light absorbing layer 150.

Hereinafter, an effect of extending a wavelength band detected by the photodetector 100 according to an example embodiment will be described with reference to FIGS. 3 to 5.

Figure 3:
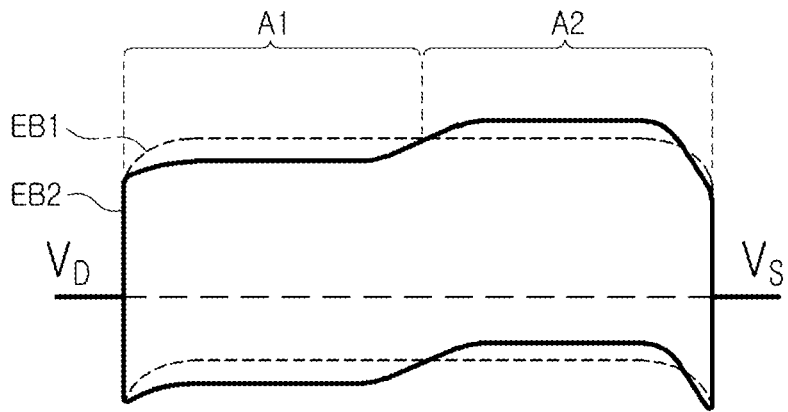
FIGS. 3 and 4 are band diagrams of the energy level of the photodetector of FIG. 1.

A first band diagram EB1 of FIG. 3 (i.e., dashed line) illustrates a case in which no voltage is applied to all of the source electrode 170, the drain electrode 180, the first gate electrode 131, and the second gate electrode 132. A second band diagram EB2 (i.e., solid line) illustrates a case in which no voltage is applied to the source electrode 170 and the drain electrode 180, but a voltage is applied only to the first gate electrode 131 and the second gate electrode 132. An example embodiment illustrates a case in which a positive voltage is applied to the first gate electrode 131 and a negative voltage is applied to the second gate electrode 132, and it can be seen that the energy band decreases in the first switching region A1 to which the positive voltage is applied, and the energy band increases in the second switching region A2 to which the negative voltage is applied.

Figure 4:
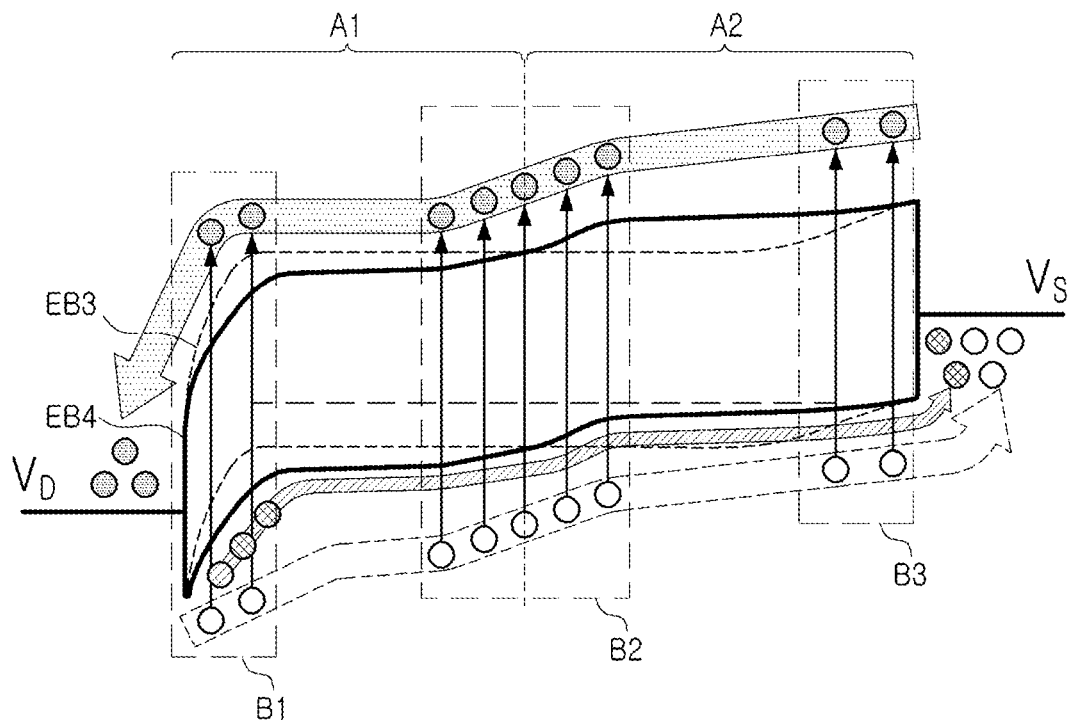

A third band diagram EB3 of FIG. 4 (i.e., dashed line) illustrates a case in which a source voltage $V_S$ and a drain voltage $V_D$ are applied to the source electrode 170 and the drain electrode 180, and no voltage is applied to the first gate electrode 131 and the second gate electrode 132. A fourth band diagram EB4 (i.e., solid line) illustrates a case in which the source voltage $V_S$ and the drain voltage $V_D$ are applied to the source electrode 170 and the drain electrode 180, and the first and second gate voltages $V_{G1}$ and $V_{G2}$ are applied to the first and second gate electrodes 131 and 132, respectively. When the first and second gate voltages $V_{G1}$ and $V_{G2}$ are applied to the first and second gate electrodes 131 and 132, respectively, in first to third regions B1 to B3 of the switching regions A1 and A2, the combination of electrons and holes increases in a low-energy long-wavelength band, thereby increasing a photocurrent $I_P$ and reducing a dark current $I_D$.

Figure 5:
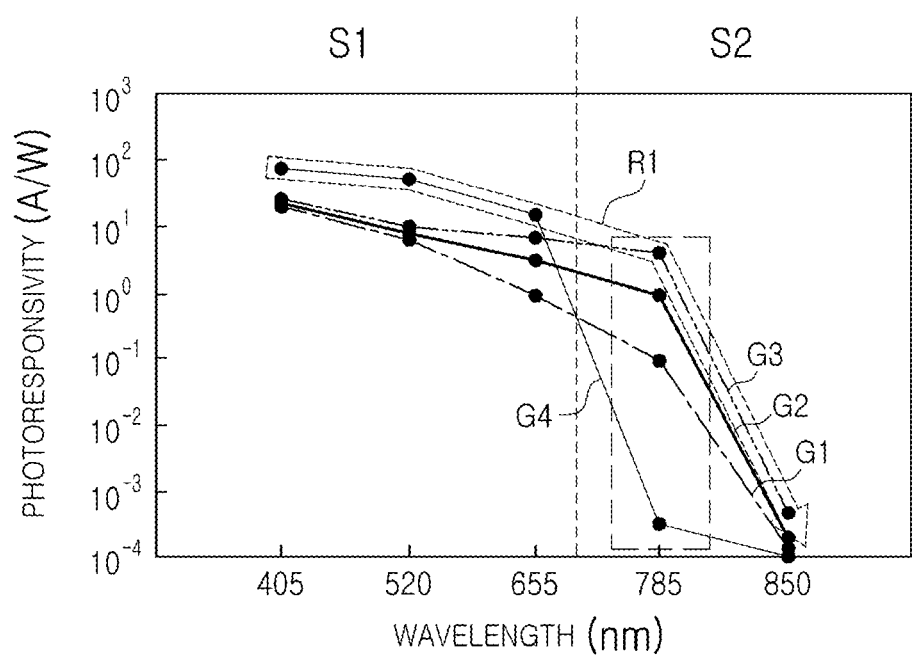
FIG. 5 is a diagram of photoresponsivities according to wavelengths of a photodetector of an example embodiment and a photodetector of a comparative example.

FIG. 5 is a diagram illustrating a change in a photoresponsivity, which is a current flowing in the light absorbing layer 150 due to incident light, according to a change in voltage applied to the first and second gate electrodes 131 and 132. G1 is a graph obtained by measuring the photoresponsivity according to the incident wavelength when +50V and −50V voltages are applied to the first and second gate electrodes 131 and 132 for 5 seconds, respectively. G2 is a graph provided by measuring the photoresponsivity according to the incident wavelength when +60V and −60V voltages are applied to the first and second gate electrodes 131 and 132 for 5 seconds, respectively. G3 is a graph provided by measuring the photoresponsivity according to the incident wavelength when +70V and −70V voltages are applied to the first and second gate electrodes 131 and 132 for 5 seconds, respectively. G4 is a graph provided by measuring the photoresponsivity according to an incident wavelength when no voltage is applied to the first and second gate electrodes 131 and 132. It can be seen that the photoresponsivity of G4 is high in the S1 region, but the photoresponsivities of G1 to G3 are high in the S2 region. In an example embodiment, when measuring the wavelength of the S1 region, the voltage is not applied to the first and second gate electrodes 131 and 132, and when measuring the wavelength of the S2 region, the voltage is applied to the first and second gate electrodes 131 and 132. Therefore, a high photoresponse characteristic R1 may be obtained over the S1 region and the S2 region. Accordingly, the light response rate of light detected by the photodetector 100 may be improved, and a detectable wavelength band may be expanded.

A photodetector 200 according to an example embodiment will be described with reference to FIGS. 6 and 7. Compared with the photodetector 100 of FIGS. 1 and 2, the photodetector 200 of an example embodiment may include first and second light absorbing layers 250 and 260, and has a difference in that a gate electrode 230 is provided as a single gate electrode. A ferroelectric layer 240 may be disposed in a second direction D4 intersecting a first direction D3 in which the gate electrode 230 is disposed. A switching region A4 in which the polarity of a dipole moment M3 disposed in a region of the ferroelectric layer 240 adjacent to the gate electrode 230 is reversed may be formed, and the state thereof may be maintained. The gate electrode 230 may be disposed to correspond to the switching region A4 in which the first and second light absorbing layers 250 and 260 overlap. However, embodiments are not limited thereto, e.g., the gate electrode 230 may be disposed to correspond to areas A3 and A5 in which the first and second light absorbing layers 250 and 260 do not overlap. Also, the gate electrode 230 may also be disposed to correspond only to the areas A3 and A5 in which the first and second light absorbing layers 250 and 260 do not overlap. For example, if necessary, the gate electrode 230 may be freely deformed to correspond to a region W in which the first and second light absorbing layers 250 and 260 are disposed. Except for these points, it can be understood that the photodetector 200 has the same as or similar characteristics to the photodetector 100 illustrated in FIGS. 1 and 2. Accordingly, descriptions overlapping with those described with reference to FIGS. 1 and 2 will be omitted.

The photodetector 200 may include the gate electrode 230, the ferroelectric layer 240 disposed on the gate electrode 230, the first and second light absorbing layers 250 and 260 disposed on the ferroelectric layer 240, a source electrode 270, and a drain electrode 280. In some embodiments, an insulating layer 220 and a support substrate 210 may be disposed below the gate electrode 230.

The first and second light absorbing layers 250 and 260 may be stacked on an upper portion of the ferroelectric layer 240, e.g., the first light absorbing layer 250 may be between the second light absorbing layer 260 and the ferroelectric layer 240. The second light absorbing layer 260 may be stacked on the first light absorbing layer 250. The first light absorbing layer 250 may be connected to the source electrode 270, and the second light absorbing layer 260 may be connected to the drain electrode 280. Each of the first and second light absorbing layers 250 and 260 may include a 2D material having a layered structure. The 2D material may include a transition metal dichalcogenide material. The transition metal dichalcogenide material may include, e.g., tungsten disulfide ($WS_2$), tungsten diselenide ($WSe_2$), molybdenum disulphide ($MoS_2$), molybdenum diselenide ($MoSe_2$), rhenium disulfide ($ReS_2$) and/or rhenium diselenide ($ReSe_2$). The first and second light absorbing layers 260 and 260 may be formed of different two-dimensional materials. For example, the first light absorbing layer 250 disposed, e.g., directly, on the upper portion of the ferroelectric layer 240 may be formed of tungsten diselenide, and the second light absorbing layer 260 disposed on the first light absorbing layer 250 may be formed of rhenium disulfide.

Hereinafter, an effect of extending a wavelength band detected by the photodetector 200 according to an example embodiment will be described with reference to FIGS. 8 to 11.

Figure 8:
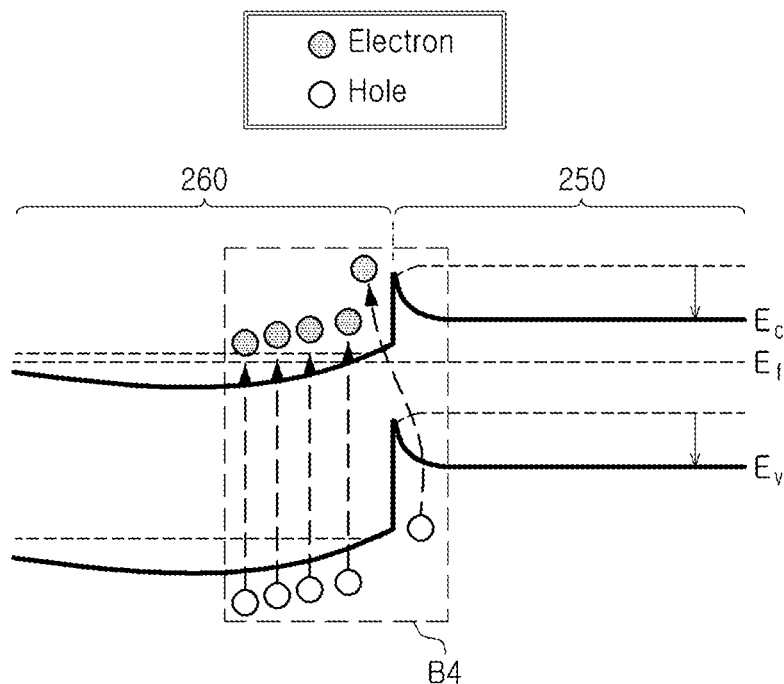
FIGS. 8 and 9 are band diagrams of the energy level of the photodetector of FIG. 6.

FIG. 8 is a band diagram illustrating energy bands of the first and second light absorbing layers 250 and 260 when a positive voltage is applied to the gate electrode 230. When the level of a conduction band $E_C$ of the first and second light absorbing layers 250 and 260 is lowered and light of a short wavelength band having high energy is irradiated, the combination of electrons and holes in one region B4 may increase. On the other hand, in light of a long wavelength band having low energy, electron-hole recombination is low. Accordingly, when a positive voltage is applied to the gate electrode 230, light in a short wavelength band may be well detected.

Figure 9:
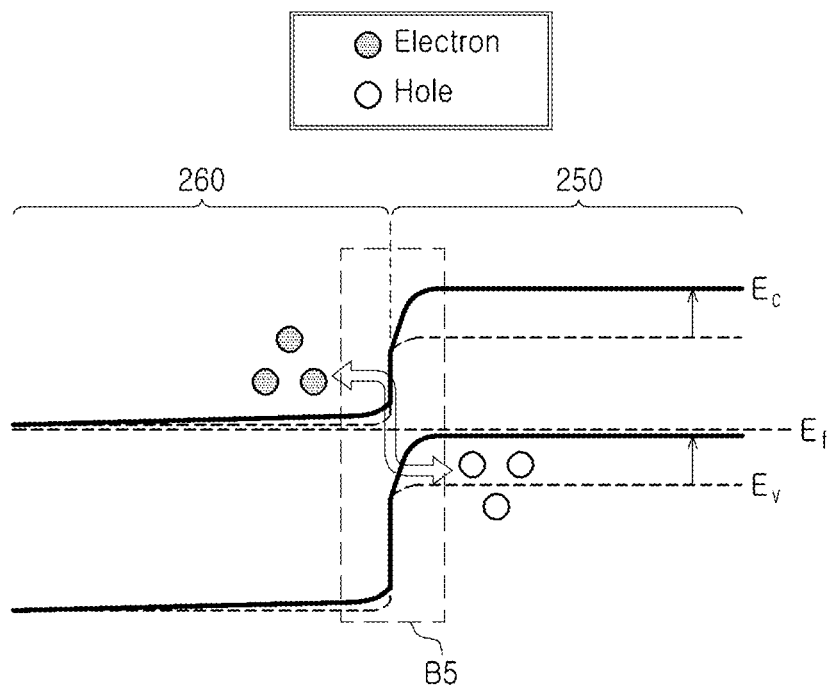

FIG. 9 is a band diagram illustrating energy bands of the first and second light absorbing layers 250 and 260 when a negative voltage is applied to the gate electrode 230. Since the level of the conduction band $E_C$ of the first and second light absorbing layers 250 and 260 is increased, when light of a high energy short wavelength band is irradiated, the electron-hole recombination is low. On the other hand, when light of a low energy long wavelength band is irradiated, electron-hole recombination may increase due to tunneling in one region B5. Accordingly, when a negative voltage is applied to the gate electrode 230, light of a long wavelength band may be well detected.

Figure 10:
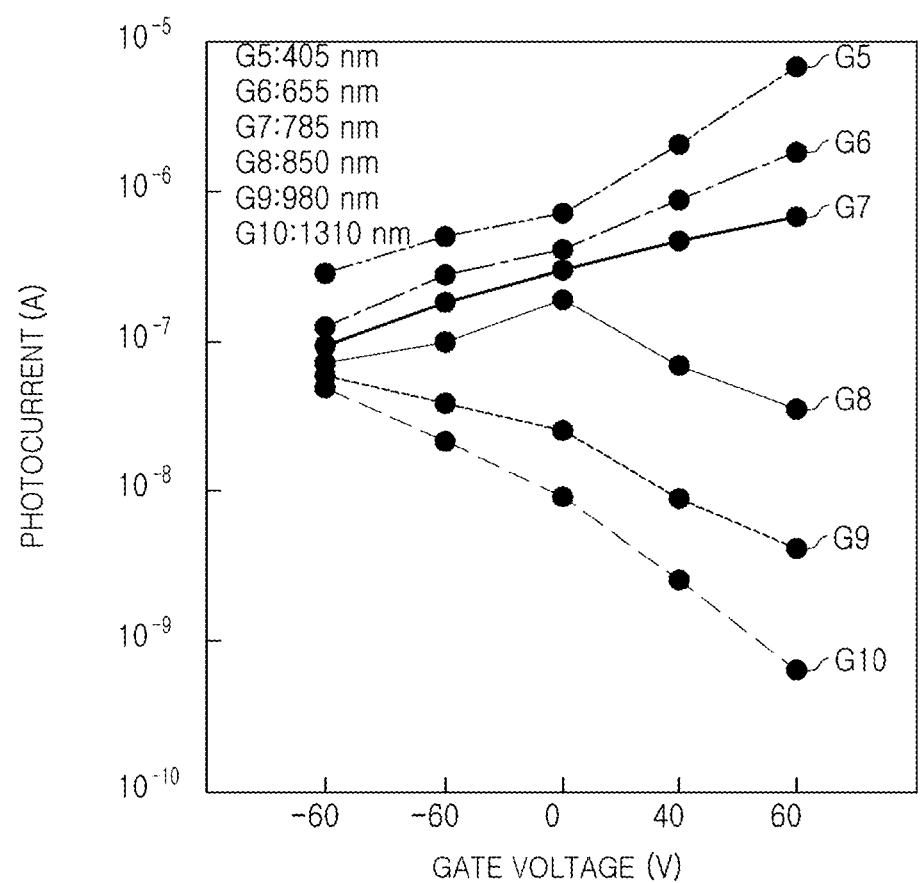
FIG. 10 is a diagram of a photocurrent detected according to a gate voltage applied to a photodetector according to an example embodiment.

FIG. 10 is a graph provided by measuring photocurrents of light G5 to G10 of each wavelength band detected by the first and second light absorbing layers 250 and 260 according to the gate voltage.

In G5 to G7, it can be seen that as the gate voltage increases, the photocurrent increases, and when the gate voltage decreases, the photocurrent also decreases. Therefore, to measure light with a short wavelength, a high photocurrent value may be obtained only when a positive voltage is applied to the gate electrode 230.

In G8, it can be seen that the photocurrent is most increased when the gate voltage is not applied.

In G9 and G10, it can be seen that as the gate voltage increases toward G10, the photocurrent decreases, and when the gate voltage decreases, the photocurrent increases. Therefore, to measure long-wavelength light, a high photocurrent value may be obtained only when a negative voltage is applied to the gate electrode 230.

Figure 11:
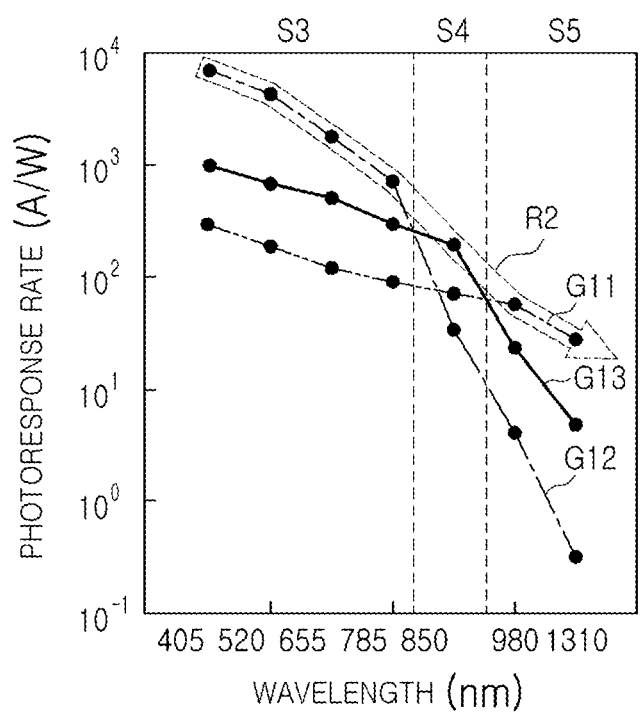
FIG. 11 is a diagram illustrating photoresponsivities according to wavelengths of a photodetector of an example embodiment and a photodetector of a comparative example.

FIG. 11 is a diagram illustrating a change in a photoresponsivity, which is a current flowing in the first and second light absorbing layers 250 and 260 due to incident light, as the gate voltage is changed. G11 is a graph provided by measuring the photoresponsivity according to the incident wavelength when a negative voltage is applied to the gate electrode 230. G12 is a graph in which a photoresponsivity is measured according to an incident wavelength when a positive voltage is applied to the gate electrode 230. G13 is a graph in which a photoresponsivity is measured according to an incident wavelength when no gate voltage is applied to the gate electrode 230.

It can be seen that the photoresponsivity of G12 is high in the S3 region, the photoresponsivity of G13 is high in the S4 region, and the photoresponsivity of G11 is high in the S5 region. Therefore, when measuring the wavelength of the S3 region, a positive voltage is applied to the gate electrode 230, and when measuring the wavelength of the S4 region, no voltage is applied to the gate electrode 230. In addition, when measuring the wavelength of the S5 region, a negative voltage is applied to the gate electrode 230. Therefore, a high photoresponse characteristic R2 may be obtained over the regions S1 to S3. Accordingly, the light response rate of the light detected by the photodetector 200 is improved, and a detectable wavelength band may be expanded.

Figure 12:
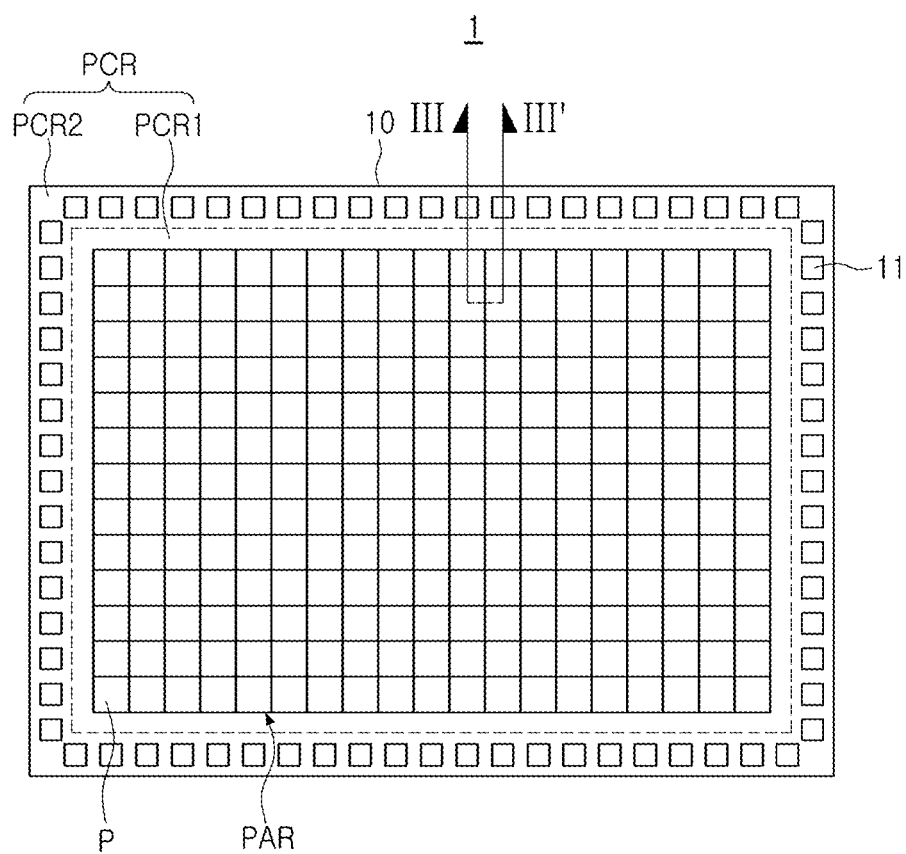
FIG. 12 is a schematic plan view of an image sensor according to an example embodiment.
Figure 13:
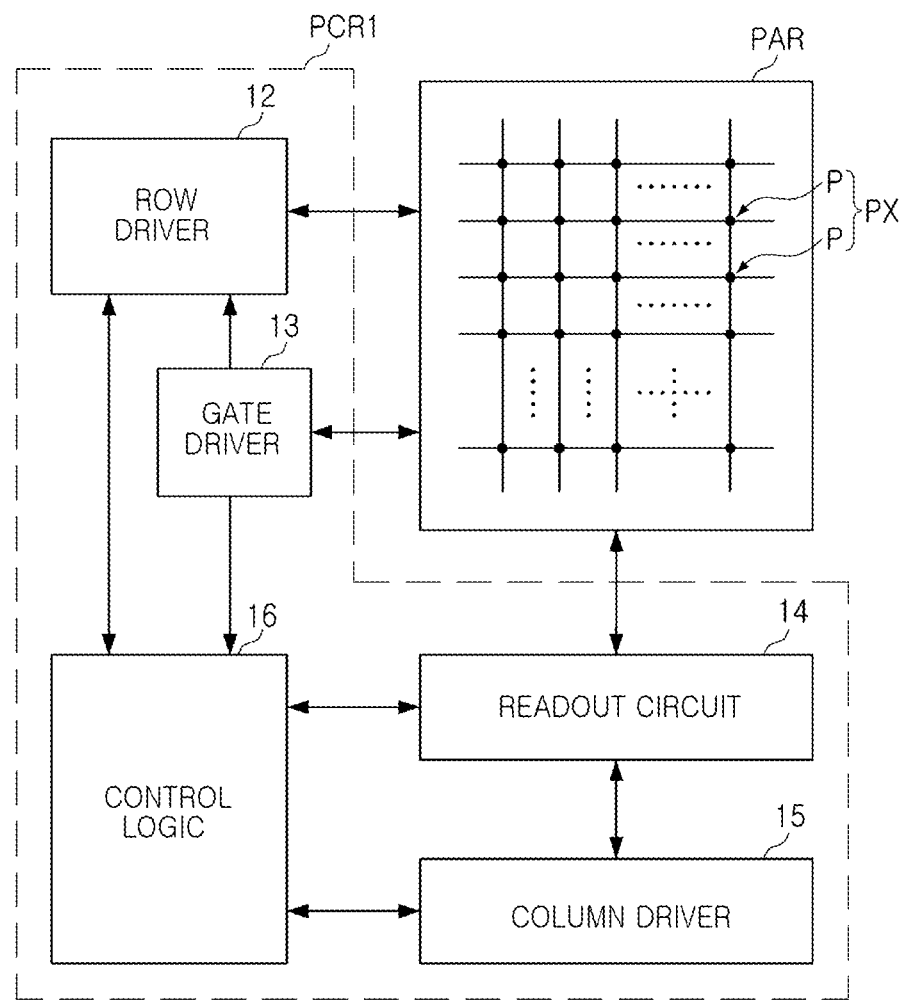
FIG. 13 is a block diagram of the image sensor of FIG. 12.
Figure 14:
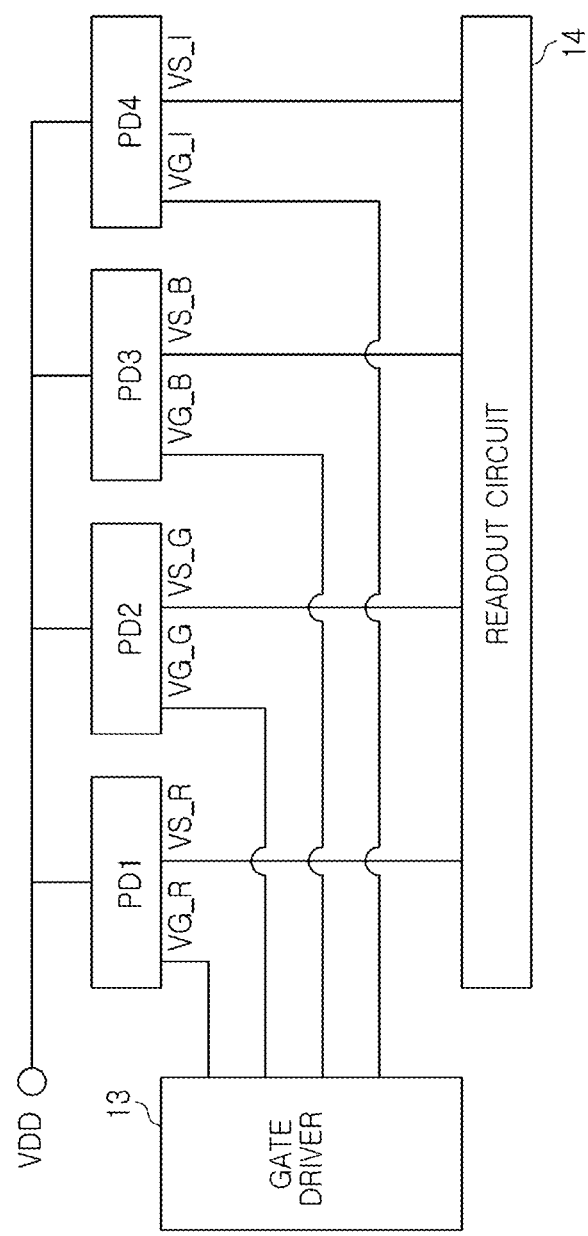
FIG. 14 is a diagram of an operation of the image sensor of FIG. 12.
Figure 15:
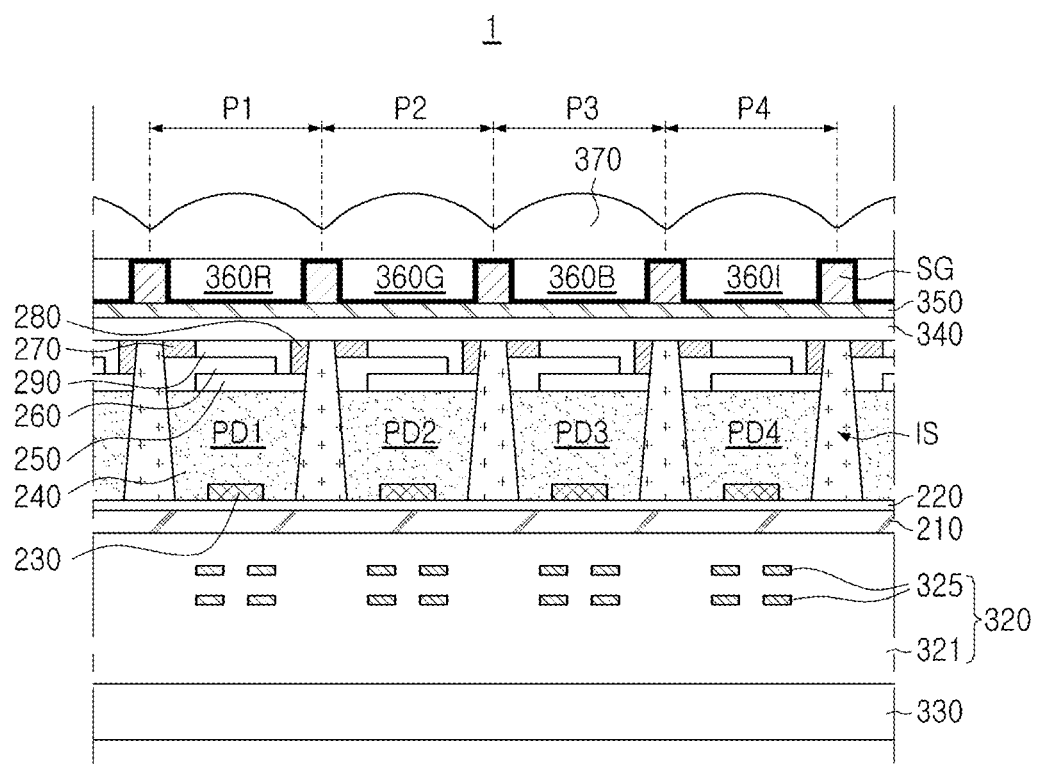
FIG. 15 is a side cross-sectional view taken along line of FIG. 12.

An image sensor according to an example embodiment will be described with reference to FIGS. 12 to 15. FIG. 12 is a schematic plan view of an image sensor according to an example embodiment, and FIG. 13 is a block diagram of the image sensor of FIG. 12. FIG. 14 is a view illustrating the operation of the image sensor of FIG. 12, and FIG. 15 is a side cross-sectional view illustrating a cross-section taken along line III-III' of FIG. 12.

Referring to FIG. 12, an image sensor 1 according to an example embodiment may include a pixel array PAR, and a peripheral circuit region PCR implemented on a substrate 10. The peripheral circuit region PCR may include a logic region PCR1 and a pad region PCR2, and refers to a region other than the pixel array PAR in the substrate 10 constituting the image sensor 1. The pad region PCR2 may include a plurality of pads 11, and the pixel array PAR may include a plurality of unit pixels P arranged, e.g., in a matrix form. The logic region PCR1 may be disposed along an edge of the pixel array PAR. The logic region PCR1 is illustrated as being positioned along all four edges of the pixel array PAR, but is not limited thereto, e.g., may be positioned along two or three edges.

Referring to FIG. 13, the logic region PCR1 may be implemented with electronic devices including a plurality of transistors. The logic region PCR1 may be configured to provide a constant signal to each unit pixel P of the pixel array PAR or control an output signal. The logic region PCR1 may include a row driver 12, a gate driver 13, a readout circuit 14, a column driver 15, a control logic 16, and the like. The row driver 12 may drive pixels PX, e.g., a plurality of unit pixels P, of the pixel array PAR in units of row lines. For example, the row driver 12 may generate a transfer control signal for controlling a transfer transistor of the pixel circuit, a reset control signal for controlling the reset transistor, a select control signal for controlling the select transistor, and the like, and may send the signals to the unit row lines of pixels PX in the pixel array PAR. The gate driver 13 may adjust the band of wavelength applied to each pixel P by controlling a voltage applied to the gate of each pixel P of the pixel array PAR.

The readout circuit 14 may include a correlated double sampler (CDS), an analog-to-digital converter (ADC), and the like. The CDS may be connected to the pixels PX through column lines. The CDS may read a pixel signal through column lines from the pixels PX connected to the row line selected by the row line selection signal of the row driver 12. The ADC may convert the pixel signal detected by the CDS into a digital pixel signal and transmit the converted signal to the column driver 15.

The column driver 15 may include a latch or buffer circuit capable of temporarily storing a digital pixel signal, an amplifier circuit, and the like, and may process a digital pixel signal received from the readout circuit 14. The row driver 12, the gate driver 13, the readout circuit 14, and the column driver 15 may be controlled by the control logic 16. The control logic 16 may include a timing controller for controlling operation timings of the row driver 12, the gate driver 13, the readout circuit 14, and the column driver 15.

Pixels PX disposed on the same position in the first direction (horizontal direction) among the pixels PX may share the same column line. For example, the pixels PX disposed on the same position in the second direction (vertical direction) may be simultaneously selected by the row driver 12 and may output pixel signals through column lines. In an example embodiment, the readout circuit 14 may simultaneously acquire pixel signals from the pixels PX selected by the row driver 12 through column lines. The pixel signal may include a reset voltage and a pixel voltage, and the pixel voltage may be a voltage in which charges generated in response to light in each of the pixels PX are reflected to the reset voltage.

In an example embodiment, at least some of the pixels PX included in the pixel array PAR may provide one pixel group. Accordingly, a plurality of pixel groups may be disposed in the pixel array PAR. At least some of the photodiodes included in one pixel group may share elements, e.g., a floating diffusion, a reset transistor, a driving transistor, and a selection transistor.

Figure 6:
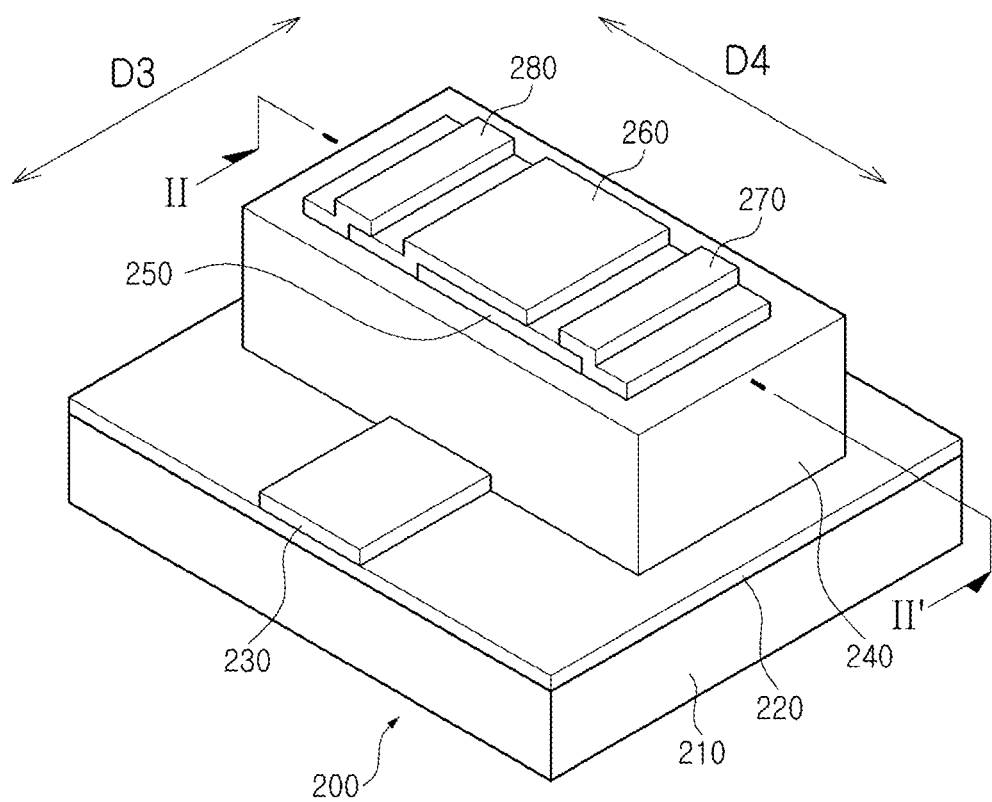
FIG. 6 is a schematic perspective view of a photodetector according to an example embodiment.
Figure 7:
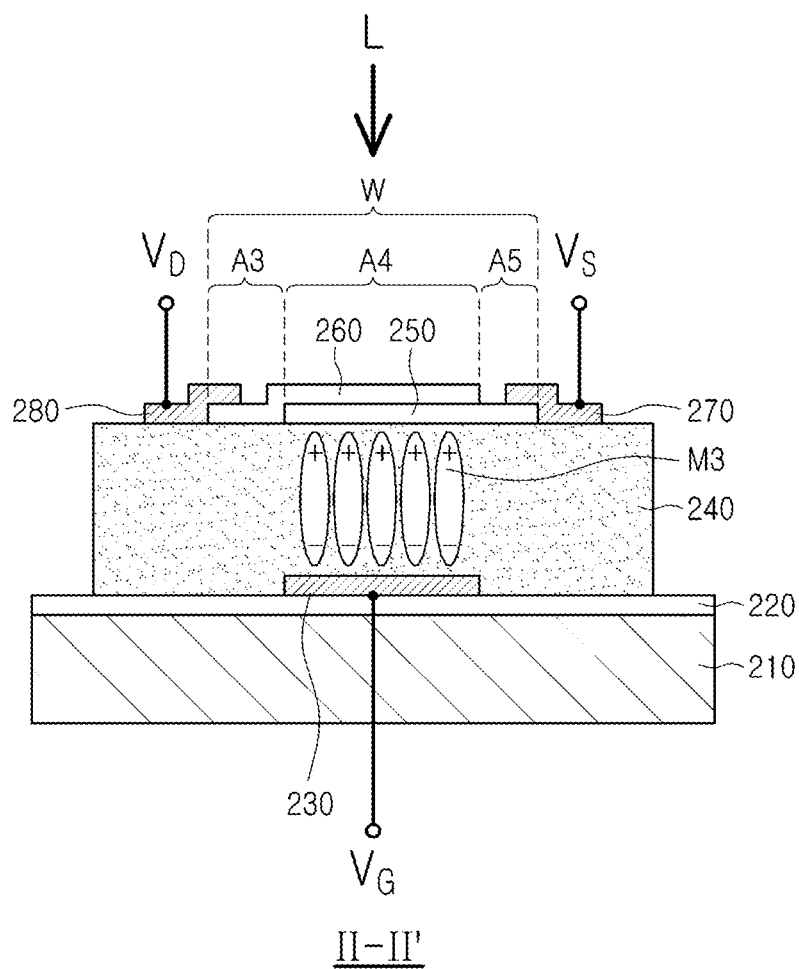
FIG. 7 is a side cross-sectional view taken along line II-II' of FIG. 6.

Referring to FIGS. 13 and 14, each of the pixels PX included in the pixel array PAR may include the photodetector of FIG. 6. In FIG. 14, as an example, only the control of first to fourth photodetectors PD1 to PD4 will be described. The first to third photodetectors PD1 to PD3 may be photodetectors for detecting light of a red wavelength, a green wavelength, and a blue wavelength of a visible ray band, respectively. The fourth photodetector PD4 may be a photodetector for detecting light in the infrared band.

In the first to fourth photodetectors PD1 to PD4, a drain voltage VDD applied to each drain electrode may be adjusted by the row driver 12, and source voltages VS_R, VS_G, VS_B, and VS_I output from respective source electrodes may be obtained from the readout circuit 14. In the first to fourth photodetectors PD1 to PD4, gate voltages VG_R, VG_G, VG_B, and VG_I applied to respective gate electrodes may be adjusted under the control of the gate driver 13. Accordingly, the gate voltage at which a highest photocurrent is detected may be applied, with respect to the light of respective wavelength bands to be detected by the first to fourth photodetectors PD1 to PD4.

Referring to FIG. 15, the image sensor 1 may include first to fourth pixels P1 to P4. First to fourth photodetectors PD1 to PD4 may be disposed in the first to fourth pixels P1 to P4, respectively. In addition, the first to fourth pixels P1 to P4 may each include a wiring layer 320, a carrier substrate 330, a barrier metal layer 340, a grid pattern SG, a color filter, and a micro lens 370. The image sensor 1 may further include a fixed charge layer 350 disposed between the barrier metal layer 340 and the color filter. The color filter may include a red filter 360R, a green filter 360G, a blue filter 360B, and an infrared filter 360I, Each of the first to fourth photodetectors PD1 to PD4 may be the photodetector 200 of FIG. 6. Accordingly, the first to fourth photodetectors PD1 to PD4 may be understood to have the same or similar configuration to the photodetector 200 illustrated in FIG. 6. Accordingly, descriptions overlapping with those described with reference to FIG. 6 will be omitted.

The first to fourth photodetectors PD1 to PD4 may each include the gate electrode 230, the ferroelectric layer 240 disposed on the gate electrode 230, the first and second light absorbing layers 250 and 260 disposed on the ferroelectric layer 240, the source electrode 270, and the drain electrode 280. The insulating layer 220 and the substrate 210 may be disposed below the gate electrode 230.

A pixel separation layer IS may be formed between the first to fourth photodetectors PD1 to PD4, respectively. When viewed from above, the pixel separation layer IS may be planarly formed in a mesh shape. The pixel separation layer IS employed in this embodiment may be formed by filling an insulating material such as oxide.

The wiring layer 320 may be disposed below the first to fourth photodetectors PD1 to PD4. The wiring layer 320 may include an interlayer insulating layer 321 and an interlayer metal wiring 325. For example, the interlayer insulating layer 321 may include an oxide film, e.g., silicon oxide or a composite film of an oxide film and a nitride film. The interlayer metal wiring 325 may be provided as an electrical wiring necessary for the operation of the first to fourth photodetectors PD1 to PD4. The interlayer metal wiring 325 may be classified as multiple layers, and may be divided into gate or word line level wiring and bit line level wiring.

The barrier metal layer 340 may be disposed above the first to fourth photodetectors PD1 to PD4. The barrier metal layer 340 may be formed of, e.g., Ti/TiN. The fixed charge layer 350 may be disposed on the barrier metal layer 340. The fixed charge layer 350 may effectively reduce the occurrence of dark current or formation of white spots due to hole accumulation on the surfaces of the first to fourth photodetectors PD1 to PD4. The fixed charge layer 350 may include a metal oxide or a metal fluoride including at least one metal of hafnium (Hf), zirconium (Zr), aluminum (Al), tantalum (Ta), titanium (Ti), yttrium (Y), and lanthanoid (La).

The grid pattern SG may be disposed on the fixed charge layer 350. The grid pattern SG is to significantly reduce optical interference between the light incident on color filters 360R, 360G, and 360B and an infrared filter 360I, and when viewed from above, the grid pattern SG may have a barrier rib structure that isolates the color filters 360R, 360G and 360B and the infrared filter 360I from each other. In the grid pattern SG, grooves may be disposed to correspond to the color filters 360R, 360G and 360B and the infrared filter 360I, respectively, and the color filters 360R, 360G and 360B and the infrared filter 360I may be disposed in the grooves, respectively.

The micro lens 370 may be disposed on the color filters 360R, 360G, and 360B and the infrared filter 360I. The micro lens 370 may be convex to correspond to each of the color filters 360R, 360G and 360B and the infrared filter 360I.

The image sensor 1 according to an example embodiment may adjust the voltage applied to the gate electrodes 230 of the first to fourth photodetectors PD1 to PD4 to adjust the wavelength band of light detected by the image sensor 1. Accordingly, the wavelength band of the light detected by the image sensor 1 may be extended.

In addition, in the image sensor 1 of the example embodiment, the first to fourth photodetectors PD1 to PD4 are disposed in front of the wiring layer 320, such that light incident from the front of the image sensor 1 may be prevented from being absorbed by the wiring layer 320. Accordingly, the amount of light detected by the first to fourth photodetectors PD1 to PD4 is increased, and thus the sensitivity of the image sensor 1 may be improved.

As set forth above, according to example embodiments, a photodetector may be configured in such a manner that the wavelength range of detected light is adjusted according to an applied gate voltage, and thus, the wavelength range of detected light may be increased. Further, an image sensor may be configured in such a manner that the wavelength range of detected light is adjusted according to an applied gate voltage, and thus, the wavelength range of detected light may be increased.

By way of summation and review, according to example embodiments, a photodetector may have an increased wavelength range of detected light. Further, an image sensor having an increased wavelength range of detected light.

That is, according to example embodiments, a photodetector may include a gate electrode below a ferroelectric layer, and the wavelength band of light detected by the photodetector may be adjusted according to the voltage applied to a gate electrode. AS such, the wavelength band of light detected by the photodetector is not limited to the characteristics of the device itself, and a relatively wider wavelength band may be measured.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A photodetector, comprising:
   at least one gate electrode extending in a first direction;
   a ferroelectric layer on the at least one gate electrode, the ferroelectric layer being configured to maintain a state of polarization formed by a gate voltage supplied to the at least one gate electrode;
   a light absorbing layer on the ferroelectric layer, the light absorbing layer intersecting the at least one gate electrode, wherein the light absorbing layer is configured such that, in response to an adjustment of the gate voltage, an energy band of the light absorbing layer adjusts;
   a source electrode on the ferroelectric layer, the source electrode being connected to a first end of the light absorbing layer; and
   a drain electrode on the ferroelectric layer, the drain electrode being connected to a second end of the light absorbing layer.

2. The photodetector as claimed in claim 1, wherein the light absorbing layer includes a transition metal dichalcogenide.

3. The photodetector as claimed in claim 2, wherein the transition metal dichalcogenide includes at least one of tungsten diselenide (WSe$_2$), tungsten ditelluride (WTe$_2$), molybdenum disulfide (MoS$_2$), molybdenum diselenide (MoSe$_2$), molybdenum ditelluride (MoTe$_2$) and rhenium disulfide (ReS$_2$).

4. A photodetector comprising:
   at least one gate electrode extending in a first direction;
   a ferroelectric layer on the at least one gate electrode, the ferroelectric layer being configured to maintain a state of polarization formed by a gate voltage supplied to the at least one gate electrode;
   a light absorbing layer on the ferroelectric layer, the light absorbing layer intersecting the at least one gate electrode;
   a source electrode on the ferroelectric layer, the source electrode being connected, to a first end of the light absorbing layer; and
   a drain electrode on the ferroelectric layer, the drain electrode being connected to a second end of the light absorbing layer;
   wherein the at least one gate electrode includes a first gate electrode and a second gate electrode, the first gate electrode and the second gate electrode being parallel to each other and intersecting the ferroelectric layer.

5. The photodetector as claimed in claim 4, wherein:
   the first gate electrode and the second gate electrode have a first region and a second region, respectively, the first region and the second region overlapping the light absorbing layer,
   the first region is adjacent to the drain electrode, and
   the second region is adjacent to the source electrode.

6. The photodetector as claimed in claim 5, wherein the first and second gate electrodes are configured to be supplied with a positive voltage and a negative voltage, respectively, the positive voltage and the negative voltage having a same absolute value and having a magnitude greater than or equal to a coercive voltage of the ferroelectric layer.

7. The photodetector as claimed in claim 6, wherein the magnitude of the positive voltage and the negative voltage is in a range of 50 V to 80 V.

8. The photodetector as claimed in claim 1, wherein the ferroelectric layer includes at least one of a copolymer of vinylidene fluoride and ethylene trifluoride (P(VDF/TrFE)) and polyvinylidene fluoride (PVDF).

9. A photodetector, comprising:
   at least one gate electrode extending in a first direction;
   a ferroelectric layer on the at least one gate electrode, the ferroelectric layer being configured to maintain a state of polarization formed by a gate voltage supplied to the at least one gate electrode;
   a first light absorbing layer on the ferroelectric layer, the first light absorbing layer extending in a second direction intersecting the at least one gate electrode, and the first light absorbing layer including a first two-dimensional (2D) material having a layered structure;
   a second light absorbing layer on the ferroelectric layer, the second light absorbing layer intersecting the at least one gate electrode and having an overlap region with the first light absorbing layer, and the second light absorbing layer including a second 2D material, different from the first 2D material;
   a source electrode on the ferroelectric layer and connected to the first light absorbing layer; and
   a drain electrode on the ferroelectric layer and connected to the second light absorbing layer.

10. The photodetector as claimed in claim 9, wherein each of the first 2D material and the second 2D material includes a transition metal dichalcogenide material.

11. The photodetector as claimed in claim 10, wherein the transition metal dichalcogenide material includes at least one of tungsten diselenide (WSe$_2$), tungsten ditelluride (WTe$_2$), molybdenum disulfide (MoS$_2$), molybdenum diselenide (MoSe$_2$), molybdenum ditelluride (MoTe$_2$) and rhenium disulfide (ReS$_2$).

12. The photodetector as claimed in claim 11, wherein the first 2D material includes tungsten diselenide (WSe$_2$), and the second 2D material includes rhenium disulfide (ReS$_2$).

13. The photodetector as claimed in claim 11, wherein the overlap region is a region in which the second light absorbing layer is stacked on the first light absorbing layer.

14. The photodetector as claimed in claim 9, wherein:
a voltage having a range of a first gate voltage to a second gate voltage is supplied to the at least one gate electrode,
as the voltage supplied to the at least one gate electrode approaches the first gate voltage, a photocurrent in a short wavelength band among wavelengths of light detected by the first and second light absorbing layers decreases, and a photocurrent in a long wavelength band increases, and
as the voltage supplied to the at least one gate electrode approaches the second gate voltage, the photocurrent in the short wavelength band among the wavelengths of the light detected by the first and second light absorbing layers increases, and the photocurrent in the long wavelength band decreases.

15. The photodetector as claimed in claim 14, wherein the first gate voltage is −60V and the second gate voltage is 60V.

16. The photodetector as claimed in claim 9, wherein as a voltage supplied to the at least one gate electrode increases, a photocurrent in a short wavelength band among wavelengths of light detected by the first and second light absorbing layers increases, and a photocurrent in a long wavelength band decreases.

17. The photodetector as claimed in claim 9, wherein the ferroelectric layer includes at least one of a copolymer of vinylidene fluoride and ethylene trifluoride (P(VDF/TrFE)) and polyvinylidene fluoride (PVDF).

18. The photodetector as claimed in claim 1, wherein the light absorbing layer is further configured such that, in response to the adjustment of the gate voltage, a photocurrent of the light absorbing layer adjusts.

19. The photodetector as claimed in claim 1, wherein the at least one gate electrode includes a first gate electrode and a second gate electrode.

* * * * *